（12）United States Patent
Hedler et al.

(10) Patent No.: US 6,979,591 B2
(45) Date of Patent: Dec. 27, 2005

(54) CONNECTION OF INTEGRATED CIRCUITS

(75) Inventors: Harry Hedler, Germering (DE);
Roland Irsigler, Munich (DE); Jens Pohl, Bernhardswald (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/446,396

(22) Filed: May 28, 2003

(65) Prior Publication Data
US 2004/0012080 A1   Jan. 22, 2004

(30) Foreign Application Priority Data
May 28, 2002   (DE) ............... 102 23 738

(51) Int. Cl.[7] .................. H01L 21/44; H01L 23/48
(52) U.S. Cl. .............. 438/107; 438/106; 257/686; 257/777; 257/778
(58) Field of Search .................. 438/613, 612, 438/107, 108, 118, 119, 106; 257/777, 778, 257/686

(56) References Cited

U.S. PATENT DOCUMENTS

| | | | | |
|---|---|---|---|---|
| 4,818,728 A | * | 4/1989 | Rai et al. ............... | 438/108 |
| 5,214,308 A | * | 5/1993 | Nishiguchi et al. ........ | 257/692 |
| 5,328,087 A | * | 7/1994 | Nelson et al. ............ | 228/175 |
| 5,477,087 A | * | 12/1995 | Kawakita et al. .......... | 257/737 |
| 5,598,033 A | * | 1/1997 | Behlen et al. ............ | 257/686 |
| 5,646,828 A | * | 7/1997 | Degani et al. ............ | 361/715 |
| 5,801,446 A | * | 9/1998 | DiStefano et al. ......... | 257/778 |
| 5,898,223 A | * | 4/1999 | Frye et al. .............. | 257/777 |
| 6,077,723 A | * | 6/2000 | Farnworth et al. ......... | 438/107 |
| 6,239,983 B1 | * | 5/2001 | Shingai et al. ........... | 361/768 |
| 6,335,571 B1 | * | 1/2002 | Capote et al. ............ | 257/787 |
| 6,462,420 B2 | * | 10/2002 | Hikita et al. ............ | 257/777 |
| 6,822,317 B1 | * | 11/2004 | Inoue et al. ............. | 257/668 |
| 6,885,106 B1 | * | 4/2005 | Damberg et al. ........... | 257/777 |
| 2002/0121706 A1 | * | 9/2002 | Tatsuta et al. ........... | 257/778 |
| 2002/0130412 A1 | * | 9/2002 | Nagai et al. ............. | 257/737 |
| 2003/0038355 A1 | * | 2/2003 | Derderian ................ | 257/686 |
| 2003/0067755 A1 | * | 4/2003 | Haimerl et al. ........... | 361/773 |

FOREIGN PATENT DOCUMENTS

| | | |
|---|---|---|
| DE | 42 26 167 A1 | 2/1994 |
| JP | 2000114386 A | 4/2000 |
| JP | 2000232200 A | 8/2000 |
| WO | WO 01/75969 A1 | 10/2001 |

\* cited by examiner

Primary Examiner—Laura M. Schillinger
Assistant Examiner—J. Mitchell
(74) Attorney, Agent, or Firm—Fish & Richardson P.C.

(57) ABSTRACT

A method for connecting a first integrated circuit having an elevated contact area lying on an elastic elevation on a main area thereof and a second integrated circuit having a corresponding non-elevated contact area on a main area thereof includes applying a liquid adhesive between the first and second main areas; aligning the first and second main areas so that the elevated contact area is opposite the corresponding non-elevated contact area; and curing the adhesive, thereby firmly connecting the first and second integrated circuits.

9 Claims, 7 Drawing Sheets

CONNECTION OF INTEGRATED CIRCUITS

FIELD OF INVENTION

The present invention relates to a method of connecting integrated circuits and to a corresponding assembly of integrated circuits.

Although it can in principle be applied to any desired integrated circuits, the present invention and the problems on which is based are explained with reference to chips with integrated circuits using silicon technology.

CLAIM OF PRIORITY

This application claims the benefit of the May 28, 2002 priority date of German application 102.23.738.7, the contents of which are herein incorporated by reference.

Customary methods of connecting chips with integrated circuits comprise the use of substrates, which are arranged between two chips, and also bonding-wire or solder-ball connections to the substrate. Polymer substrates similar to printed circuit boards or so-called leadframes are a usually used as substrates.

BACKGROUND

The use of substrates between the chips has the following disadvantages. They greatly increase the distance between two chips, which leads to a great stack height. They are restricted to relatively great spacings of the contact areas. They cannot be used in parallel processes, for example at wafer level. Additional connecting elements, such as wire bonds or bumps for example, such as wire bonds or bumps for example, must be provided to accomplish the connection between the wiring plane on the chip and the interposed substrate.

The use of solder balls for contacting the substrate is accompanied by further disadvantages. To keep the stack height as small as possible, it is advisable for only very small solder balls to be used. These very small solder balls are usually produced by means of electrochemical (galvanic) depositing on a photostructured surface. Together with the creation of a solder resist layer, this technology requires two additional lithographic steps. Furthermore, solder bumps are not mechanically stable enough, for which reason they have to be subsequently underfilled. Altogether, these disadvantages make the solder bump technology a very expensive technology.

WO 01/75969 discloses a chip with an integrated circuit and a wiring on a surface with metal-coated elevations for electrically connecting the circuit, the elevations comprising an elastic material and respectively having a metallic contact area on their tips and a line path on their sloping side or in their volume, which path is arranged between the contact area and a conductor track.

Figure 8:
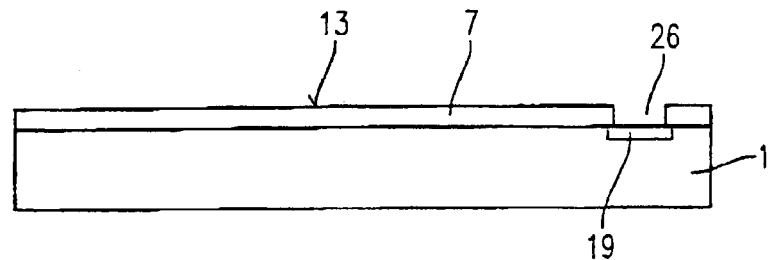
Figure 9:
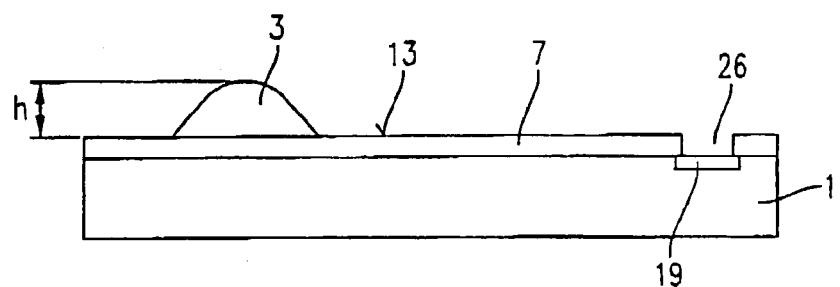
Figure 10:
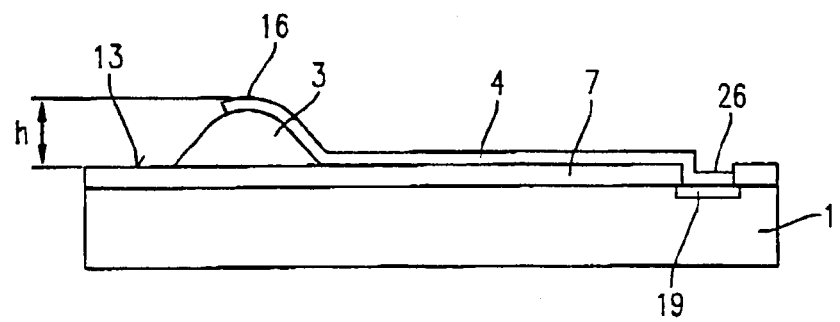

FIGS. 8–10 are schematic representations of production of an integrated circuit known from WO 01/75969 A1, with a wiring plane with elastic elevations.

With respect to FIG. 8, reference numeral 1 designates a semiconductor chip with a terminal region 19 of an integrated circuit not shown here, which is accommodated in the semiconductor chip. Provided on the semiconductor chip 1 is an insulating layer 7, which has a surface 13, with a through-hole 26 being provided to expose the terminal region 19.

FIG. 9 shows that an elastic elevation 3 with a height h is provided on the surface 13 of the insulating layer 7. Used for example for this purpose is a silicone-based elastic elastomer, which is applied via a perforated stencil to the surface 13 of the insulating layer 7 by a printing process. The stencil (not represented) itself comprises, for example, a perforated metal foil. By setting the viscosity and the composition of the silicone, the form and height h of the elastic elevation 3 can be specifically set.

FIG. 10 illustrates how a metal layer structure is applied to the surface 13 of the insulating layer 7 and to the surface of the elastic elevation 3 and also into the through-hole 26, said metal layer structure connecting the terminal region 19 to a contact area 16 on the tip of the elastic elevation 3 via a conductor track 4 on the insulating layer 7. In this respect it should be noted that the regions 16 and 4 may be structured identically or differently. For example, the contact area 16 may have a greater cross section than the conductor track 4.

SUMMARY

It is an object of the present invention to provide an easier and less costly method of connecting integrated circuits and a corresponding assembly of integrated circuits.

The idea on which the present invention is based is to use the necessary wiring plane on the chips not only for intra-chip connections but also for inter-chip connections.

For this purpose, before the depositing of the wiring metallization, elastic elevations are created at the points of the chip surface at which electrical connections to a further chip are later to be created. The height of the elevations is preferably a little greater than the intermediate space between the two chip surfaces after the connection. This can be achieved in particular by the curing of a connecting adhesive being performed under pressure, that is with slightly compressed elevations. When the wiring metallization is provided, one or more conductor tracks are brought together on the tip of the elastic elevations.

When bringing together the front sides of chips to be connected to another, the elevations press with the conductor tracks brought together on them onto corresponding contact areas of the chip respectively lying opposite, which after curing of an adhesive leads to a stable electrical inter-chip connection. Particularly good results can be achieved with gold surfaces at the connecting points.

The present invention leads to a less costly technology on account of fewer process steps, to be precise because only two additional process steps are required, that is the creation of the elastic elevations at the connecting points and the pre-curing of the adhesive during the connection of the two chips, created by applying a predetermined pressure. Parallel processing of chips at wafer level is also possible. Materials with low costs can be used, and finally the technology according to the invention makes a reduced stack height possible.

Parallel processing is possible not only at wafer level, but also when using a hot pressing plate—similar to a smoothing iron—for curing the connecting adhesive for a plurality of pairs of chips simultaneously. Finally, the elasticity of the elevations makes it possible to compensate for inhomogeneities in the height of the elevations or the thickness of the conductor track coating.

The electrical contact is very stable when gold surfaces are used at the connecting points, in particular connections cured under pressure have in tests withstood over 3000 temperature cycles of between −45° C. and 125° C.

Suitable in particular, but not exclusively, as materials for the metallization are gold, but also titanium, copper, nickel and so on. Suitable in particular as the material for the elastic elevations is inexpensive silicone with a low modulus of elasticity (<1000 MPa, in particular <10 MPa).

According to a further preferred development, pressing together of the first and second main areas is performed, so that the elevated contact areas are deformed.

According to a further preferred development, the curing of the adhesive takes place at least partly while the elevated contact areas are deformed, so that the deformations are frozen in.

According to a further preferred development, the first integrated circuit is mounted on a substrate before the alignment.

According to a further preferred development, before the alignment of the contact areas on the main surfaces of the two chips, the bonding pads are connected to the contact areas on the substrate by means of bonding wires.

According to a further preferred development, a multiplicity of pairs of a first and second integrated circuit are simultaneously aligned and firmly connected.

According to a further preferred development, the integrated circuits are provided in wafer form, chip form or hybrid form.

Figure 1A:
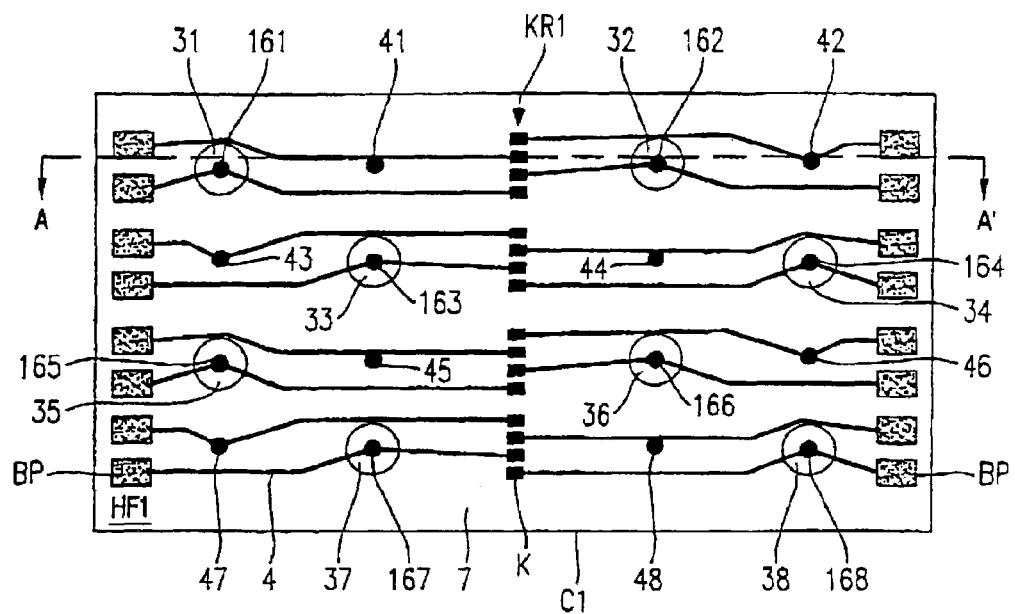
Figure 1B:
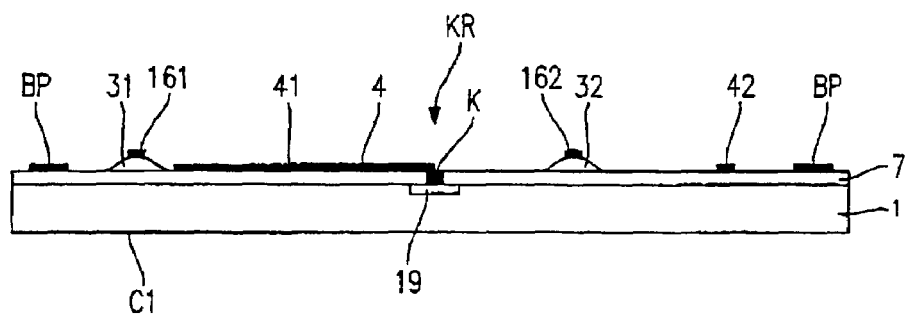
Figure 2A:
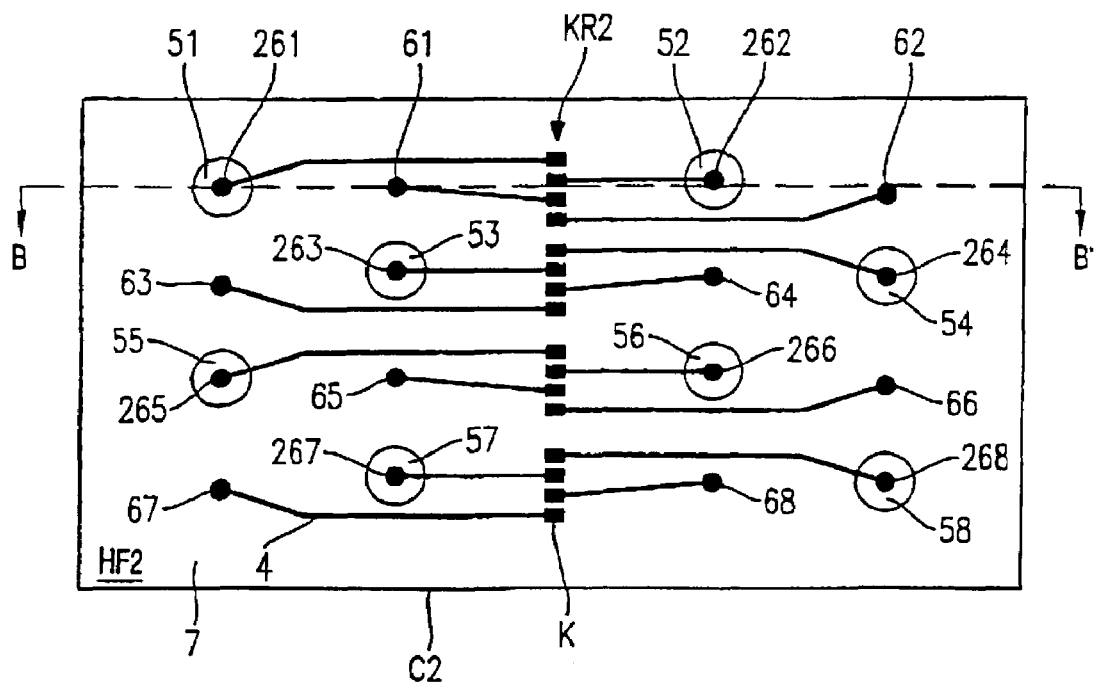
Figure 2B:
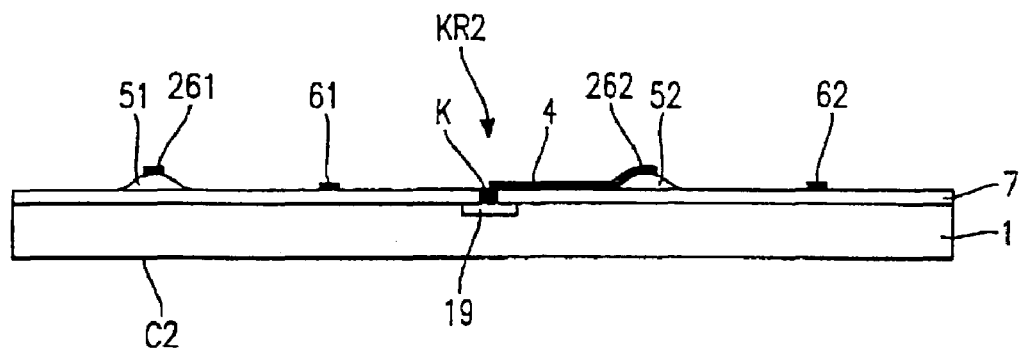
Figure 3A:
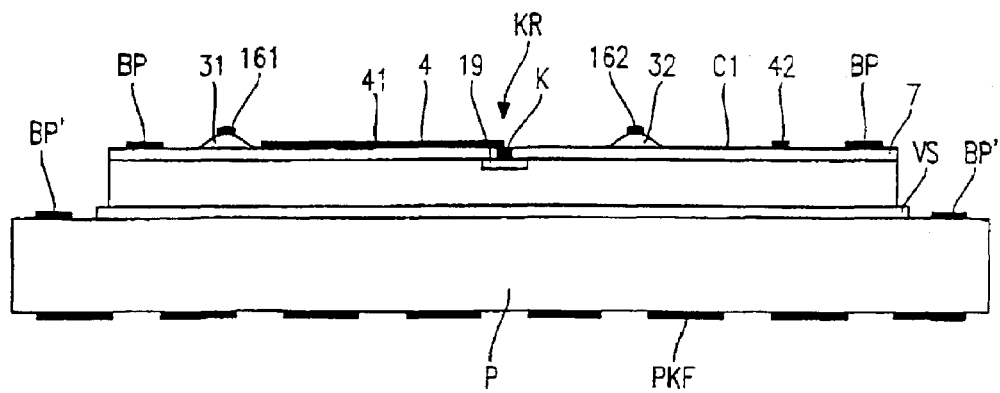
Figure 3B:
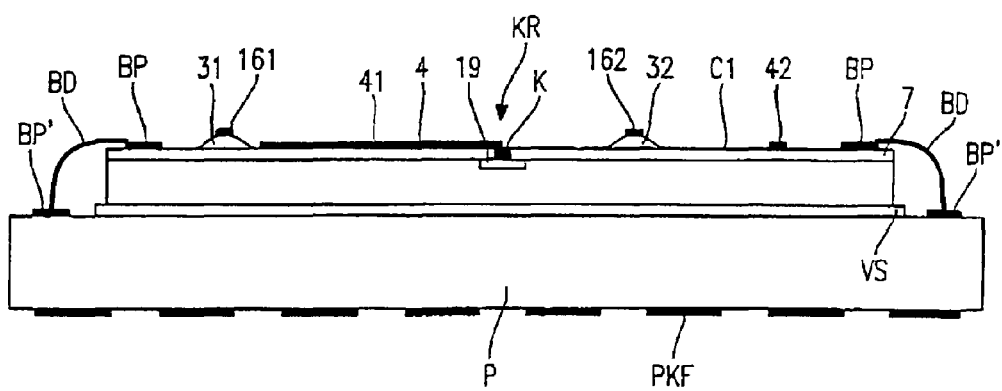
Figure 4A:
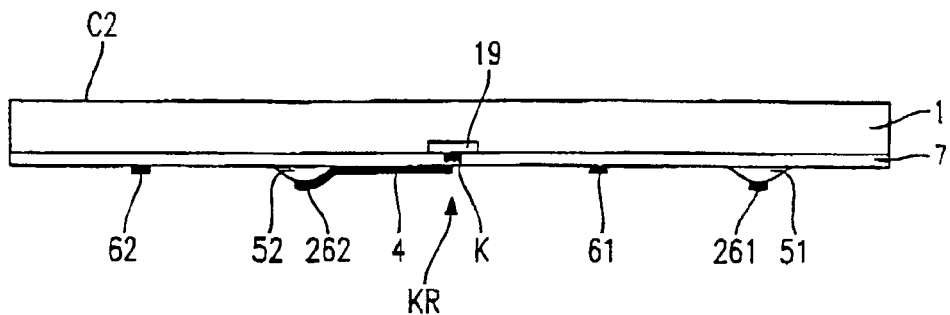
Figure 4B:
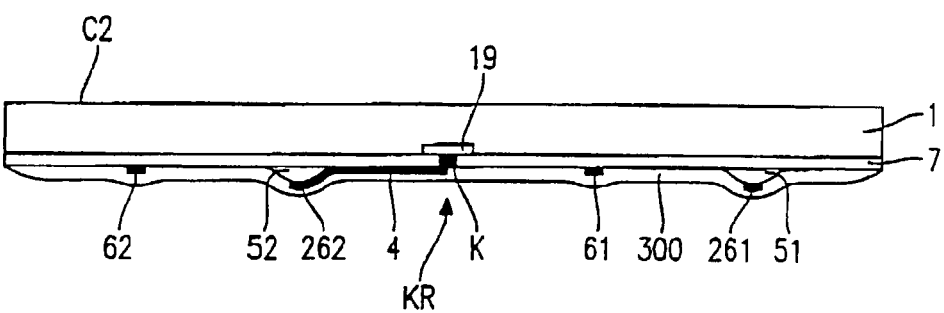
Figure 4C:
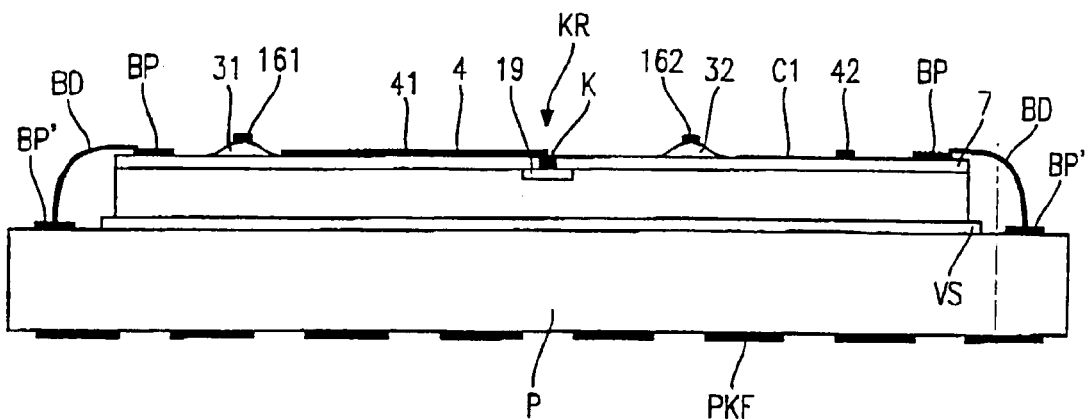
Figure 5A:
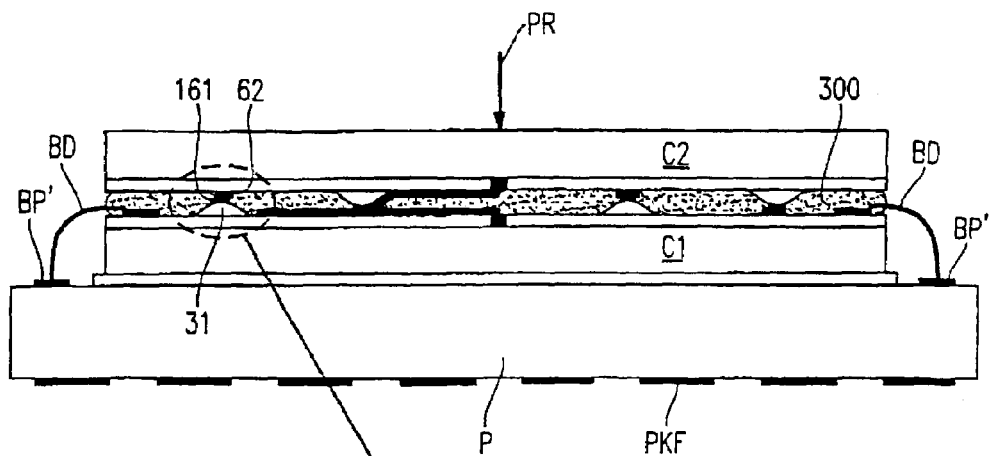
Figure 5B:
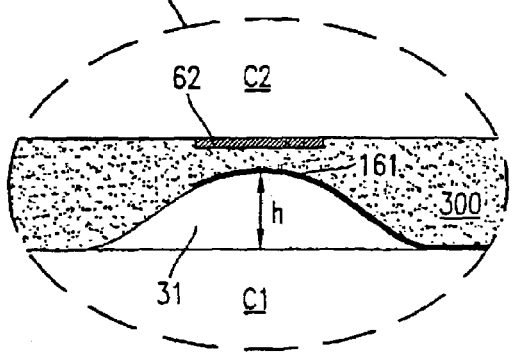
Figure 5C:
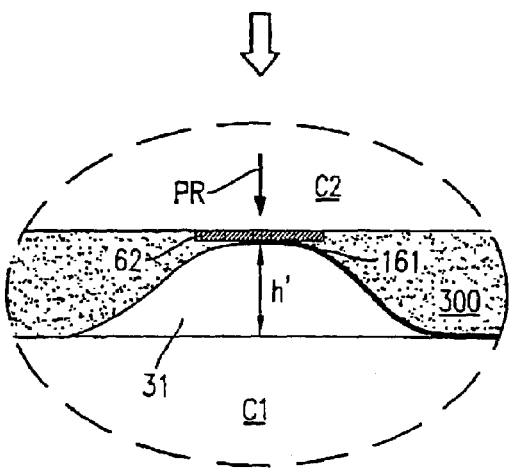
Figure 6:
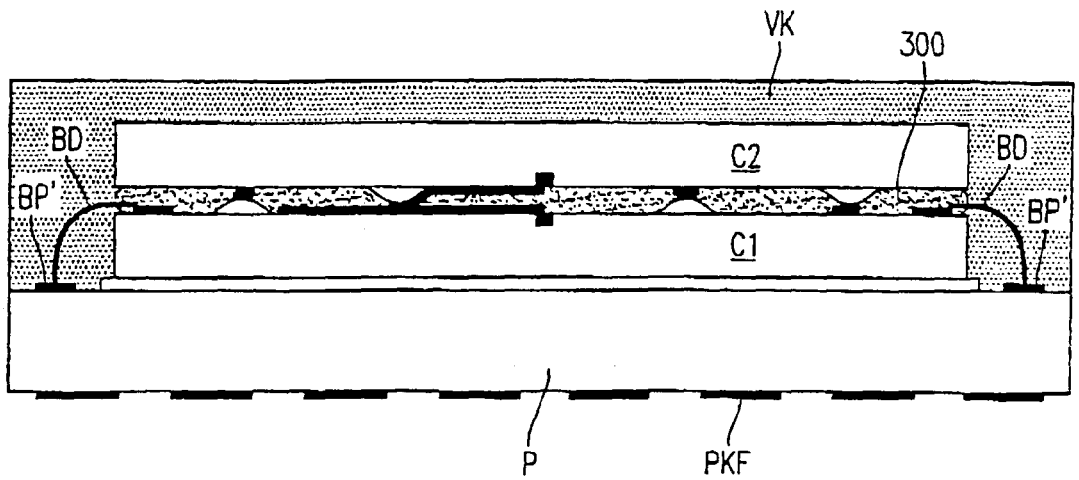
Figure 7:
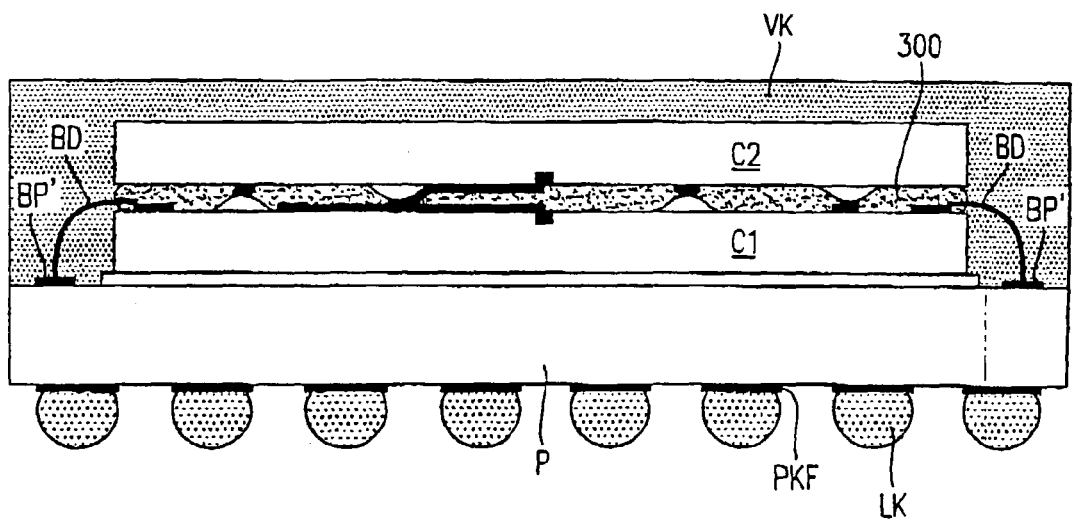

An exemplary embodiment of the invention is explained in more detail in the description which follows and is represented in the drawings, in which:

FIGS. 1a,b show schematic representations of a first chip with an integrated circuit using silicon technology for use in the case of an embodiment of the method according to the present invention, to be precise FIG. 1a in plan view and FIG. 1b in section along a line A–A' in FIG. 1a;

FIGS. 2a,b show schematic representations of a second chip with an integrated circuit using silicon technology for use in the case of the embodiment of the method according to the present invention, to be precise FIG. 2a in plan view and FIG. 2b in section along a line A–A' in FIG. 2a;

FIGS. 3a,b show schematic representations of the pre-mounting of the first chip from FIG. 1b onto a substrate in the case of the embodiment of the method according to the present invention;

FIGS. 4a–c show schematic representations of the mounting of the second chip from FIG. 2b onto the mounted first chip according to FIG. 3b in the case of the embodiment of the method according to the present invention;

FIGS. 5a–c show schematic representations of an assembly of the first and the second chip in the case of the embodiment of the method according to the present invention, FIGS. 5b and 5c showing enlargements of details from FIG. 5a, which reproduce two successive stages of the process;

FIGS. 6, 7 show schematic representations of the further mounting of the assembly from FIG. 5a; and FIGS. 8–10 show schematic representations of the production of an integrated circuit known from WO 01/75969 A1 with a wiring plane with elastic elevations.

In the figures, the same references designate the same or functionally the same components.

FIGS. 1a,b are schematic representations of a first chip with an integrated circuit using silicon technology for use in the case of an embodiment of the method according to the present invention, to be precise FIG. 1a in plan view and FIG. 1b in section along a line A–A' in FIG. 1a.

In FIGS. 1a,b, reference C1 designates a first semiconductor chip with an integrated circuit not shown in any more detail. Provided on the main area HF1 of the semiconductor chip C1 is the known insulating layer 7, on which the metallization of the wiring is located.

In particular, the metallization of the wiring comprises bonding areas BP, conductor tracks 4, contacts K to the terminal regions 19, which are arranged in a central row of contacts KR1, and also contact areas 161 to 168 and 41 to 48. In this case, the contact areas 161 to 168 are arranged on corresponding elastic elevations 31 to 38, whereas the contact areas 41 to 48 are arranged directly on the insulating layer 7. The contact areas 161 to 168 and 41 to 48 and the bonding areas BP and also the contacts K are, as it were, widened regions of the conductor tracks 4 and are created in the same production step as these.

The production of the semiconductor chip C1 with this wiring takes place in the way known from WO 01/75969 A1.

FIGS. 2a,b are schematic representations of a second chip with an integrated circuit using silicon technology for use in the case of the embodiment of the method according to the present invention, to be precise FIG. 2a in plan view and FIG. 2b in section along a line A–A' in FIG. 2a.

In FIGS. 2a,b, reference C2 designates a second semiconductor chip with an integrated circuit not shown in any more detail. Provided on the main area HF2 of the semiconductor chip C2 is the known insulating layer 7, on which the metallization of the wiring is located. In particular, the metallization of the wiring comprises conductor tracks 4, contacts K to the terminal regions 19, which are arranged in a central row of contacts KR2, and also contact areas 261 to 268 and 61 to 68. In this case, the contact areas 261 to 268 are arranged on corresponding elastic elevations 51 to 58, whereas the contact areas 61 to 68 are arranged directly on the insulating layer 7. The contact areas 261 to 268 and 61 to 68 and the contacts K are, as it were, widened regions of the conductor tracks 4 and are created in the same production step as these.

The production of the semiconductor chip C2 with this wiring likewise takes place in the way known from WO 01/75969 A1.

As comparison of FIG. 1a and FIG. 2a shows, the wirings of the semiconductor chips C1, C2 are arranged in such a way that, after the semiconductor chip C2 has been turned over, the contact areas 261 to 268 located on the elastic elevations 51 to 58 come into contact with the contact areas 41 to 48 of the first semiconductor chip C1 located on the insulating layer 7.

By analogy, the contact areas 61 to 68 lying on the insulating layer 7 of the second semiconductor chip C2 come into contact with the contact areas 161 to 168 of the first semiconductor chip C1 lying on the elastic elevations 31 to 38.

In other words, a respective contact area lying on an elastic elevation always comes into contact with a contact area lying on the insulating layer 7, that is a non-elevated contact area. As a result, a plane-parallel connecting arrangement of the two semiconductor chips C1, C2 can be achieved, in which the main areas HF1, HF2 are directed toward each other and in which the spacing in the unloaded state is determined by the height h of the elastic elevations.

In the case of the present example, the wirings are arranged in particular in relation to the row of contacts KR1 and KR2 respectively located in the center of the chip, which brings advantages in the later connection of the two semiconductor chips C1, C2 with regard to parasitic capacitances, inductances and with regard to the line lengths.

FIGS. 3a,b are schematic representations of the pre-mounting of the first chip from FIG. 1b onto a substrate in the case of the embodiment of the method according to the present invention.

According to FIG. 3a, in a next process step the first semiconductor chip C1 is adhesively bonded or soldered onto a substrate P by means of a connecting layer VS, to be precise in such a way that its first main area HF1 is directed upward.

The substrate P likewise has bonding pads BP', which according to the representation of FIG. 3b are connected to the representation of FIG. 3b are connected to the bonding pads BP of the first semiconductor chip C1 by means of bonding wires BD. Reference PKF designates rear contact areas of the substrate P, which are connected in an electrically conducting manner to the bonding pads BP'. This electrical connection has not been depicted however.

FIGS. 4a–c are schematic representations of the mounting of the second chip from FIG. 2b onto the mounted first chip according to FIG. 3b in the case of the embodiment of the method according to the present invention.

As illustrated in FIGS. 4a to c, the second semiconductor chip C2 is then turned over and its main area HF2 wetted with an adhesive 300, for example a resin adhesive. Then the wetted second semiconductor chip C2 is aligned with respect to the first semiconductor chip C1, mounted on the substrate P, into the desired position, i.e. in such a way that the contact areas 261 to 268 lie opposite the contact areas 41 to 48 and the contact areas 61 to 68 lie opposite the contact areas 161 to 168. Subsequently, the contact areas 261 to 268 are brought into contact with the contact areas 41 to 48 and the contact areas 61 to 68 are brought into contact with the contact areas 161 to 168.

FIGS. 5a–c are schematic representations of an assembly of the first and the second chip in the case of the embodiment of the method according to the present invention, FIGS. 5b and 5c showing enlargements of details from FIG. 5a, which reproduce two successive stages of the process.

For reasons of overall clarity, some references already introduced have been omitted in the representation of FIG. 5a.

According to FIG. 5a, the upper second semiconductor chip C2 is then pressed with pressure PR onto the lower first semiconductor chip C1, mounted on the substrate P.

As this happens, the adhesive 300 flows into the entire intermediate space between the semiconductor chips C1, C2.

The enlargement of a detail of FIGS. 5b,c explains by using the example of the elastic elevation 31 the operation of connecting the two semiconductor chips C1, C2 by the contact area 161 of the first semiconductor chip C1 and the opposing contact areas 62 of the second semiconductor chip C2.

At first, the two contact areas 161 and 62 are spaced apart from each other, and between them there is still the adhesive 300. The undeformed elastic elevation 31 has in this case a height h.

Then, with reference to FIG. 5c, the pressure PR is applied to the upper, second semiconductor chip C2, so that the adhesive 300 is forced out of the intermediate space between the contact areas 161 and 62, and the latter enter into a conductive connection. As this happens, the elastic elevation 31 deforms and then has a height h', which is smaller than its undeformed height h. The elasticity of the elastic elevation 31 and of the further elastic elevations ensures that possible unevennesses can be evened out in this way.

In the state according to FIG. 5c, a pre-curing of the adhesive 300 then takes place in order to freeze in the state with the deformed elastic elevations, which ensures on the one hand that the electrical connection is kept under prestress and on the other hand that the unevennesses remain evened out.

In this connection it should be mentioned that the pre-curing or curing of the adhesive 300 may either be brought about by the device for creating the pressure PR being a heating plate or heating punch, or be performed externally by introducing radiation.

For this, parallel processing of a multiplicity of pairs of chips is possible.

FIGS. 6, 7 are schematic representations of the further mounting of the assembly from FIG. 5a.

According to the representation of FIG. 6, after the complete curing of the adhesive 300, an encapsulation of the connected semiconductor chips C1, C2 and of the laterally led-out electrical connections with the bonding wires BD takes place by encapsulating or overmolding with an epoxy resin or a similar substance to form a mechanical protection VK.

Finally, with respect to FIG. 7, small solder balls LK are applied to the rear contact areas PKF of the substrate P, to make it possible for the packaged chip assembly to be mounted onto a customary circuit board or the like.

Although the present invention has been described above on the basis of a preferred exemplary embodiment, it is not restricted to this, but instead can be modified in various ways.

In particular, the invention is not restricted to single chips, but can also be applied to hybrids, wafers or other integrated circuits.

In a further embodiment, the flat contact areas and elastic elevations are not connected to one another by means of a pre-stressed pressure contact, but by a soldered connection or an electrically conductive adhesive connection.

What is claimed is:

1. A method for connecting a first integrated circuit and a second integrated circuit, the method comprising:
providing a plurality of first integrated circuits, each of which includes a first wiring device on a first main surface, and a corresponding plurality of second integrated circuits, each of which includes a second wiring device on a second main surface, the plurality of first integrated circuits and the plurality of second integrated circuits being in the form of chip pairs; wherein one of the first and second wiring devices comprises a plurality of elevated contact areas lying on respective elastic elevations and wherein the other of the first and second wiring devices comprises a plurality of non-elevated contact areas that can be aligned to the elevated contact areas;
mounting the first integrated circuits onto a substrate;
dispensing a liquid adhesive on at least one of the first and second main surfaces;
aligning the first and second main areas so that the elevated contact area and the corresponding non-elevated contact area are brought into electrical contact;
pressing said first and second main areas by simultaneously applying pressure onto the plurality of second integrated circuits using a pressure plate, such that the elevated contact areas are deformed; and
curing the adhesive, thereby firmly connecting the first and second integrated circuits, wherein curing the adhesive includes at least partially curing the adhesive while the elevated contact area is deformed such that the elevated contact area remains deformed subsequent to connecting the first and second integrated circuits.

2. The method of claim 1, further comprising providing a bonding wire in electrical communication with a contact area on the substrate and a contact area on the first circuit device.

3. The method of claim 1, further comprising selecting at least one of the first and second integrated circuits to be in wafer form.

4. The method of claim 1, further comprising selecting at least one of the first and second integrated circuits to be in chip form.

5. The method of claim 1, further comprising selecting at least one of the first and second integrated circuits to be in the form of a hybrid of a wafer and a chip.

6. The method of claim 1, further comprising connecting the elevated contact area and the non-elevated contact area with solder.

7. The method of claim 1, further comprising connecting the elevated contact area and the non-elevated contact area with an electrically conducting adhesive.

8. The method of claim 1, further comprising, prior to aligning, connecting contact areas on the substrate to contact areas on an edge region of the first main surface by bonding wires such that the bonding wires are embedded in a respective space between said first and second integrated circuits in the adhesive.

9. The method of claim 1, wherein the elevated contact areas are connected to the non-elevated contact areas by at least one of solder and an electrically conductive adhesive.

* * * * *